United States Patent
Nakamura (10) Patent No.: US 12,518,973 B2
(45) Date of Patent: Jan. 6, 2026

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 352 days.

(21) Appl. No.: 18/176,615

(22) Filed: Mar. 1, 2023

(65) Prior Publication Data

US 2023/0282486 A1    Sep. 7, 2023

(30) Foreign Application Priority Data

Mar. 7, 2022    (JP) .................................. 2022-034664

(51) Int. Cl.
| | |
|---|---|
| *H01L 21/304* | (2006.01) |
| *H01L 21/67* | (2006.01) |
| *H01L 21/683* | (2006.01) |
| *H01L 21/77* | (2017.01) |
| *H01L 21/78* | (2006.01) |

(52) U.S. Cl.
CPC ............ *H01L 21/304* (2013.01); *H01L 21/78* (2013.01)

(58) Field of Classification Search
CPC .............. H01L 21/78; H01L 21/67092; H01L 21/67132; H01L 21/6836; H01L 2221/68327
See application file for complete search history.

(56) References Cited

U.S. PATENT DOCUMENTS

| | | | | |
|---|---|---|---|---|
| 2004/0266138 A1* | 12/2004 | Kajiyama | ............... | H01L 24/27 257/E21.599 |
| 2008/0277061 A1* | 11/2008 | Kobayashi | ........ | H01L 21/02087 700/95 |
| 2012/0003816 A1* | 1/2012 | Shimotani | ............... | H01L 21/78 257/E21.599 |
| 2013/0224438 A1* | 8/2013 | Matsuyama | ...... | H01L 21/31116 428/157 |
| 2014/0295643 A1* | 10/2014 | Nakamura | .......... | H01L 21/6836 438/462 |
| 2017/0011965 A1* | 1/2017 | Nakamura | .............. | H01L 21/78 |
| 2017/0162521 A1* | 6/2017 | Nakamura | ............ | H01L 21/304 |
| 2017/0207181 A1* | 7/2017 | Nakamura | .......... | H01L 21/6836 |
| 2018/0102288 A1* | 4/2018 | Bae | ........................ | H01L 21/78 |

(Continued)

FOREIGN PATENT DOCUMENTS

| | | |
|---|---|---|
| JP | 2009141176 A | 6/2009 |
| JP | 2014078569 A | 5/2014 |
| JP | 202218650 A | 1/2022 |

OTHER PUBLICATIONS

Japanese Patent Application No. 2022-034664: English translation of Office Action, Oct. 7, 2025 (3 pages).

*Primary Examiner* — Mohsen Ahmadi (74) *Attorney, Agent, or Firm* — Greer, Burns & Crain, Ltd (57) ABSTRACT

Provided is a wafer processing method including a back surface film processing step of removing or roughening a back surface film that is applied to the back surface of the wafer, a protective member providing step of providing a protective member to a front surface of the wafer before or after the back surface film processing step is carried out, and a back surface grinding step of holding the protective member side on a chuck table and grinding the back surface of the wafer with grinding stones to thin the back surface of the wafer to a desired thickness.

10 Claims, 8 Drawing Sheets

(56) References Cited

U.S. PATENT DOCUMENTS

| | | | | |
|---|---|---|---|---|
| 2018/0151508 | A1* | 5/2018 | Nakamura | H01L 21/78 |
| 2018/0330957 | A1* | 11/2018 | Wei | H01L 21/3065 |
| 2018/0350641 | A1* | 12/2018 | Nakamura | B32B 38/10 |
| 2019/0146345 | A1* | 5/2019 | Takahashi | H01L 21/6715 |
| | | | | 427/240 |
| 2020/0043788 | A1* | 2/2020 | Nakamura | H01L 21/6836 |
| 2020/0111710 | A1* | 4/2020 | Nakamura | B24B 7/228 |
| 2021/0057260 | A1* | 2/2021 | Matsuzawa | H01L 21/67219 |
| 2021/0125870 | A1* | 4/2021 | Nakamura | B23K 26/53 |
| 2021/0159080 | A1* | 5/2021 | Nakamura | B23K 26/0853 |
| 2021/0257256 | A1* | 8/2021 | Nakamura | H01L 21/268 |
| 2021/0265209 | A1* | 8/2021 | Nakamura | B23K 26/53 |
| 2021/0270749 | A1* | 9/2021 | Nakamura | G01N 21/8803 |
| 2021/0327744 | A1* | 10/2021 | Nakamura | H01L 21/78 |
| 2022/0016741 | A1 | 1/2022 | Suzuki | |
| 2022/0037160 | A1* | 2/2022 | Sekiya | H01L 21/02013 |
| 2022/0181157 | A1* | 6/2022 | Tanoue | B23K 26/0006 |
| 2022/0184754 | A1* | 6/2022 | Nakamura | B23K 26/364 |
| 2022/0301934 | A1* | 9/2022 | Nakamura | H01L 21/78 |
| 2022/0375742 | A1* | 11/2022 | Kim | B23K 26/38 |
| 2023/0023820 | A1* | 1/2023 | Nakamura | H01L 21/67115 |
| 2023/0061427 | A1* | 3/2023 | Senda | C30B 29/06 |

\* cited by examiner

WAFER PROCESSING METHOD

BACKGROUND OF THE INVENTION

Field of the Invention

The present invention relates to a wafer processing method of grinding a back surface of a wafer formed with a plurality of devices on a front surface thereof, the front surface being demarcated by a grid of a plurality of crossing division lines.

Description of the Related Art

In processing a wafer having a plurality of devices such as integrated circuits (ICs) and large-scale integrations (LSIs) on a front surface thereof, the plurality of devices being separated from each other by a plurality of crossing division lines formed on the front surface of the wafer, a back surface of the wafer is ground by use of a grinding apparatus to thereby reduce a thickness of the wafer to a desired thickness. Thereafter, the wafer is divided along the division lines by use of a dicing apparatus or a laser processing apparatus to thereby obtain a plurality of individual device chips. These device chips thus divided are used in electrical equipment such as mobile phones and personal computers.

In addition, the present applicant has proposed such a technique that a focusing point of a laser beam of a wavelength passing through a wafer is positioned inside the wafer corresponding to each division line, the laser beam is applied thereto to thereby form a modified layer as a start point of division, and a back surface of the wafer is then ground to reduce the thickness of the wafer to a desired thickness, dividing the wafer into individual device chips. Accordingly, an attempt to improve the quality of the device chip has been made (for example, see Japanese Patent Laid-open No. 2014-078569).

In recent years, kinds and the number of layered films required to improve the performance and function of a device formed on a front surface of a semiconductor wafer have been increased, and as a multilayered device has been further developed, the back surface side of the wafer is covered with a back surface film including an unnecessary metal film, oxide film, and other films.

SUMMARY OF THE INVENTION

Meanwhile, in a state in which an unnecessary back surface film is formed on the back surface of the wafer, the back surface of the wafer is fed from an upper side to be ground to a desired thickness by use of a grinding unit including a grinding wheel in a rotatable manner, the grinding wheel having grinding stones arranged in an annular form thereon. Then, part of the back surface film enters front surfaces of the grinding stones which have been selected in order to properly grind the semiconductor wafer, causing clogging. Consequently, the back surface of the wafer may not be properly ground.

It is accordingly an object of the present invention to provide a wafer processing method by which it is possible to eliminate such a problem that a back surface of a wafer cannot properly be ground when grinding the back surface of the wafer having a back surface film formed thereon.

In accordance with an aspect of the present invention, there is provided a wafer processing method of grinding a back surface of a wafer having a plurality of devices on a front surface of the wafer, the plurality of devices being separated from each other by a plurality of crossing division lines formed on the front surface of the wafer, the back surface of the wafer being covered by a back surface film, the method including a back surface film processing step of removing or roughening the back surface film, a grinding preparation step of preparing a grinding apparatus including a grinding unit rotatably provided with a grinding wheel having a plurality of grinding stones in an annular shape disposed on a lower surface thereof, a chuck table for holding the wafer, and a feeding mechanism which moves the grinding wheel in a vertical direction to make the grinding stones of the grinding wheel come closer to and away from the chuck table, a protective member providing step of providing a protective member to the front surface of the wafer before or after the back surface film processing step is carried out, and a back surface grinding step of holding the protective member side on the chuck table, grinding the back surface of the wafer with the grinding stones to thin the back surface of the wafer to a desired thickness.

Preferably, the back surface film processing step is a step of removing an outer periphery of the back surface film that is applied to the back surface of the wafer or a step of removing a central region of the back surface film, in addition to the outer periphery of the back surface film that is applied to the back surface of the wafer. Preferably, the back surface film processing step is a step of positioning a focusing point of a laser beam to the outer periphery of the back surface film that is applied to the back surface of the wafer and applying the laser beam to the wafer to perform ablation processing, and roughening the back surface film. Preferably, in the grinding step, the grinding wheel is rotated from an outer periphery of the wafer toward an inner side of the wafer.

According to the wafer processing method of the present invention, it is possible to eliminate a problem that the metal film, the oxide film, and other films constituting the back surface film cause clogging to be generated in a grinding stone that perform the back surface grinding step, and the back surface of the wafer can properly be ground.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Hereinafter, a wafer processing method according to preferred embodiments of the present invention will be described in detail with reference to the attached drawings.

Figure 1:
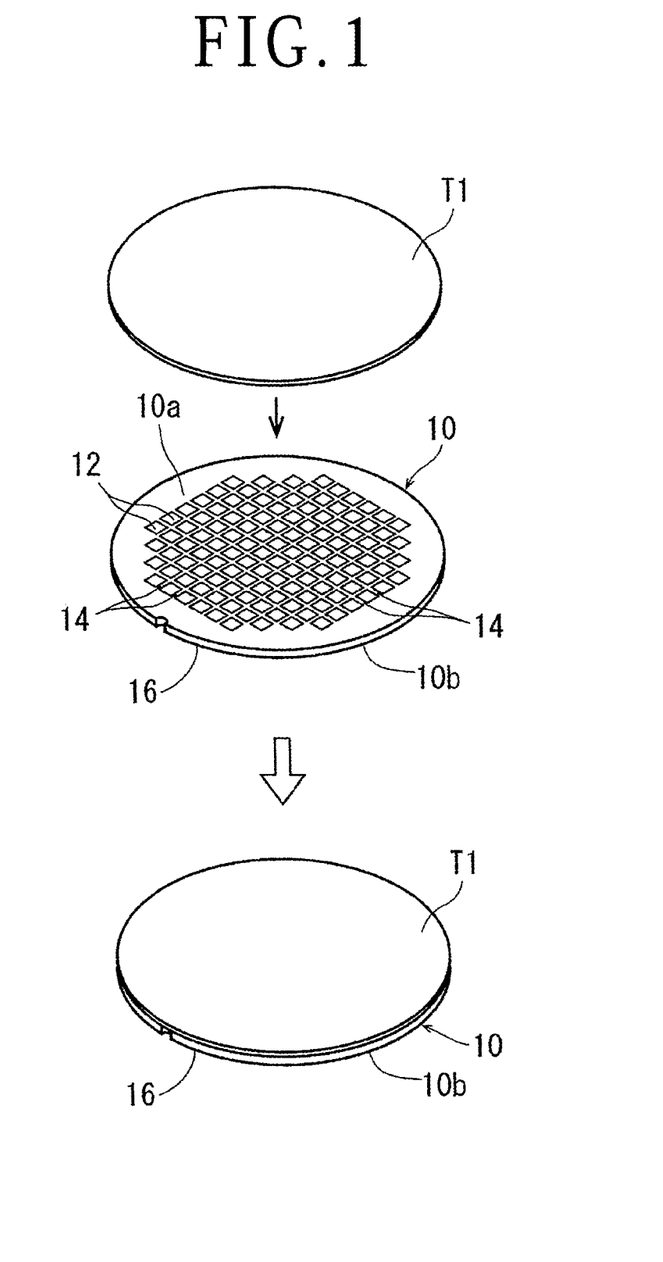
FIG. 1 is a perspective view depicting a wafer and a manner how a protective member providing step is carried out, according to a preferred embodiment of the present invention.

In FIG. 1, there is illustrated a wafer 10 to be processed by the wafer processing method according to the present embodiment. The wafer 10 is formed by layering a functional layer on an upper surface of a semiconductor substrate having a disc shape, and a plurality of crossing division lines 14 are formed on a front surface 10a of this functional layer to thereby define a plurality of separate regions where a plurality of devices 12 are individually formed. The semiconductor substrate is a substrate formed of silicon (Si), for example. On a back surface 10b side of the wafer 10, a back surface film 16 including a metal film, an oxide film, and other films which are applied to the back surface 10b through procedures of forming the devices 12 is formed. In carrying out the wafer processing method according to this embodiment to grind the back surface 10b of the wafer 10, as depicted in FIG. 1, a protective member providing step in which a protective member T1 is provided on the front surface 10a of the wafer 10 to be integrated with the wafer 10 is carried out. The protective member T1 may be formed of any material and is not limited to a particular kind of material, and may be formed of a polyolefin sheet having an adhesive layer on a surface to be attached to the wafer 10, for example. Note that a timing at which this protective member providing step is carried out can also be set after a back surface film processing step to be described later is carried out and before a back surface grinding step is carried out.

Figure 2A:
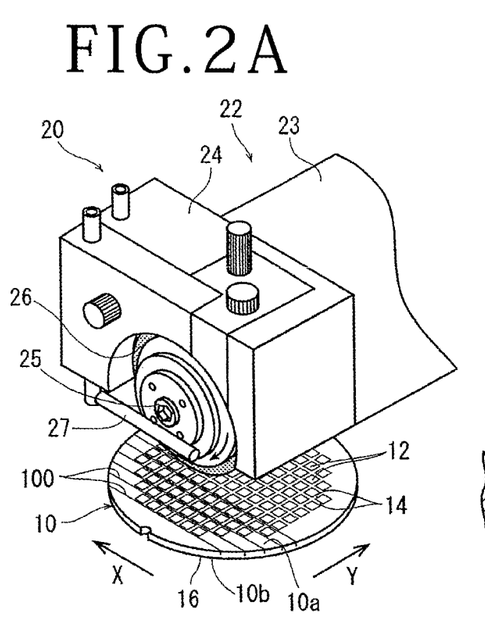
FIG. 2A is a perspective view depicting a manner how cutting grooves each having a depth corresponding to a finished thickness of each device are formed in the wafer before the protective member providing step is carried out.

In addition, the above-described protective member providing step is not limited to adhering of the protective member T1 to the front surface 10a of the wafer 10 which is unprocessed, and can be carried out after desired processing is carried out on the front surface 10a of the wafer 10 as well. More specifically, for example, before the above-described protective member providing step is carried out, the wafer 10 is transferred to a cutting apparatus 20 (only partially illustrated here) depicted in FIG. 2A. The cutting apparatus 20 includes a chuck table (not illustrated) for holding the wafer 10 under suction, and a cutting unit 22 which cuts the wafer 10 held under suction on the chuck table. The chuck table includes a moving mechanism (not illustrated) which rotatably moves to processing feed the chuck table in a direction indicated with an arrow X in FIG. 2A. The cutting unit 22 includes a spindle 25 which is disposed in a Y-axis direction indicated with an arrow Y in FIG. 2A, is held in a spindle housing 23, and is rotationally driven by an unillustrated electric motor, an annular cutting blade 26 which is covered with a blade cover 24 formed on a distal end portion of the spindle housing 23 and held on a distal end of the spindle 25, a cutting water supplying nozzle 27 which supplies cutting water to a tip end portion of the cutting blade 26, and a Y-axis moving mechanism (not illustrated) which indexing feeds the cutting blade 26 in the Y-axis direction.

The wafer 10 is transferred to the cutting apparatus 20 and placed on the chuck table of the cutting apparatus 20 with the front surface 10a of the wafer 10 facing upward, to be held under suction thereon. Then, a predetermined division line 14 extending in a first direction of the wafer 10 is aligned with the X-axis direction, and alignment between the predetermined division line 14 and the cutting blade 26 is carried out. Subsequently, while the cutting water is supplied from the cutting water supplying nozzle 27, the cutting blade 26 rotating at a high speed is positioned to the predetermined division line 14 that has been aligned with the X-axis direction, cutting in the wafer 10 from the front surface 10a side, and the chuck table is processing fed in the X-axis direction, to form a cutting groove 100 having a depth corresponding to a finished thickness of each device 12. In addition, the cutting blade 26 of the cutting unit 22 is indexing fed on a next predetermined division line 14 which has not been formed with a cutting groove 100 yet and is adjacent in the Y-axis direction to the division line 14 along which the cutting groove 100 has been previously formed. Then, in the similar manner to that described above, cutting processing of forming the cutting groove 100 is carried out. As these processes are repeated, along all the division lines 14 extending in the first direction, the cutting grooves 100 are formed (see a partially enlarged cross-sectional view depicted in FIG. 2B as well). Next, the chuck table is rotated at 90 degrees, and a predetermined division line 14 extending in a second direction perpendicular to a direction in which the cutting grooves 100 have been formed earlier is aligned with the X-axis direction, and the above-described cutting processing is carried out on all the division lines 14 extending in the second direction, so that the cutting grooves 100 are formed along all the division lines 14 of the wafer 10, as depicted in FIG. 2C.

Figure 2B:
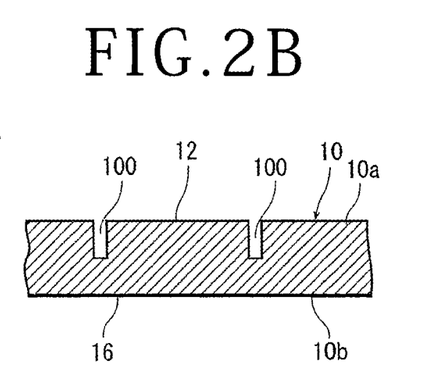
FIG. 2B is a partially enlarged cross-sectional view depicting the cutting grooves formed in the wafer depicted in FIG. 2A.
Figure 2C:
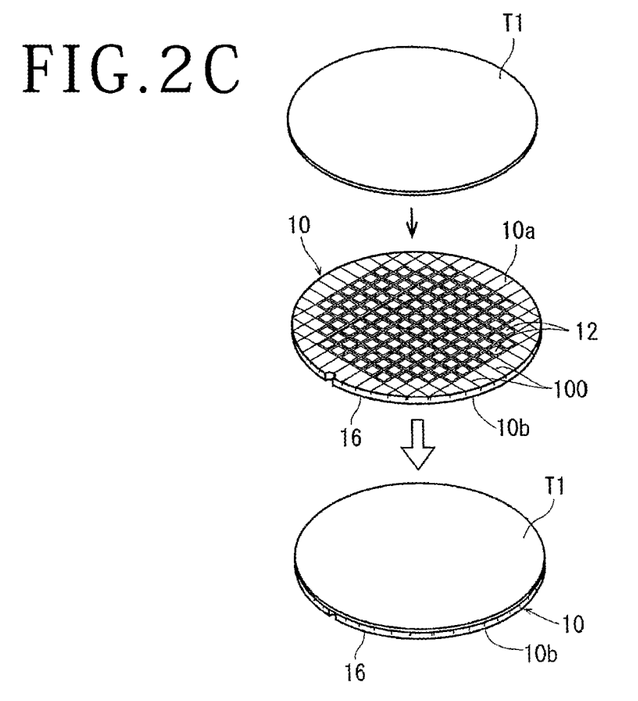
FIG. 2C is a perspective view depicting a manner how the protective member providing step is carried out after the cutting grooves depicted in FIG. 2A are formed.

As depicted in FIG. 2C, adhering the protective member T1 onto the front surface 10a of the wafer 10 after the cutting grooves 100 are formed along the division lines 14 by the cutting apparatus 20 described above is included in the protective member providing step of the wafer processing method according to the embodiment of the present invention. Note that, in the following description, first, an embodiment in which the unprocessed wafer 10 integrated with the protective member T1 being adhered to the front surface 10a of the wafer 10 is referred to as a workpiece, which has been described above with reference to FIG. 1, will be described.

Figure 3A:
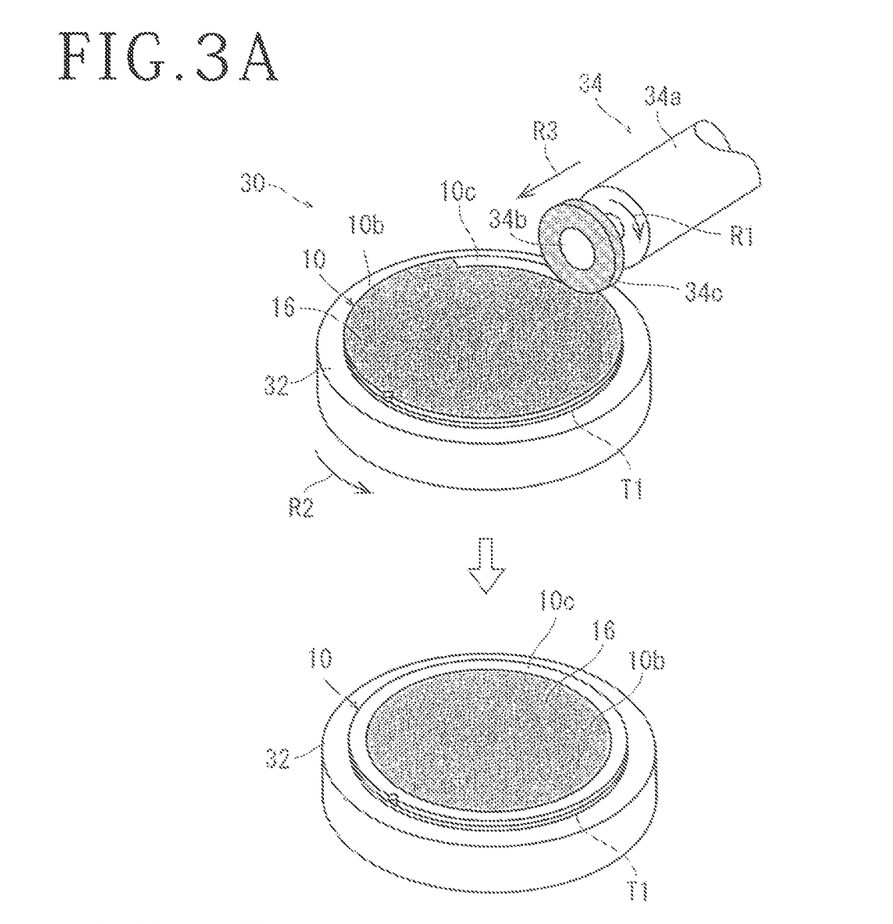
FIG. 3A is a perspective view depicting a manner how an annular exposed portion is formed in a back surface of the wafer in a back surface film processing step.

The unprocessed wafer 10 integrated with the protective member T1 being provided and adhered to the front surface 10a of the wafer 10 in the protective member providing step that has been described above with reference to FIG. 1 is transferred to a back surface film processing apparatus 30 (only partially illustrated) depicted in FIG. 3A. The back surface film processing apparatus 30 depicted in FIG. 3A includes a chuck table 32 for holding the wafer 10 under suction, and a back surface film grinding unit 34. The back surface film grinding unit 34 includes a spindle housing 34a having a drive motor not illustrated, a spindle 34b rotatably held in the spindle housing 34a, and a disc-shaped grinding stone 34c mounted on a distal end portion of the spindle 34b.

In a state in which the protective film T1 side of the wafer 10 transferred to the back surface film processing apparatus 30 faces downward and the back surface 10b formed with the back surface film 16 faces upward, the wafer 10 is placed on the chuck table 32 to be held under suction. Then, the grinding stone 34c of the back surface film grinding unit 34 is rotated at high speed in a direction indicated with an arrow R1, and a distal end portion of the grinding stone 34c is positioned at a predetermined region of an outer periphery of the back surface 10b of the wafer 10. Thereafter, the chuck table 32 is rotated in a direction indicated with an arrow R2. For the grinding stone 34c, a stone having a roughness suitable for removing the back surface film 16 including the metal film, the oxide film, or other films, and a depth of grinding feeding is set at a depth corresponding to a thickness of the back surface film 16 to carry out the back surface film processing step. As described above, as depicted on the lower side of FIG. 3A, the outer peripheral region other than the central region of the back surface film 16 covering the back surface 10b of the wafer 10 is removed, and an exposed portion 10c in which the semiconductor substrate included in the wafer 10 is exposed in a ring shape. The exposed portion 10c is set to a width of substantially 4 to 5 mm from the outer edge of the wafer 10, for example. In this manner described above, the back surface film processing step of the wafer processing method according to the embodiment of the present invention is completed.

Figure 3B:
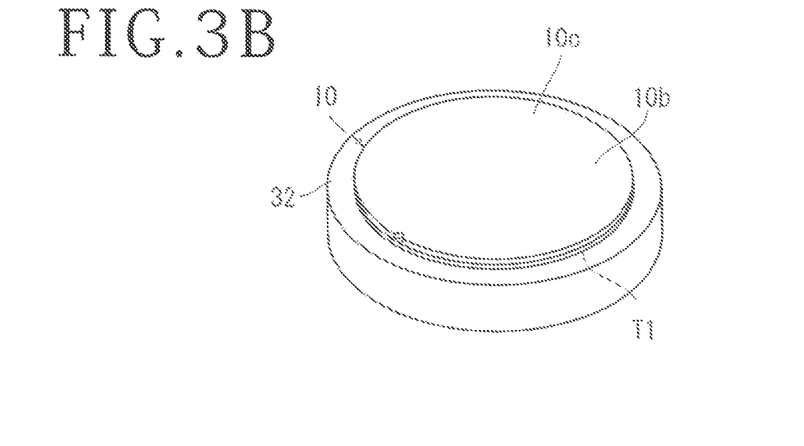
FIG. 3B is a perspective view of the wafer in a case in which the back surface film covering the entire region of the back surface of the wafer is removed to form the exposed portion in the back surface film processing step.

The back surface film processing step of the wafer processing method according to the present invention is not limited to the embodiment described above, and various modifications are included. For example, in the back surface film processing apparatus 30 depicted in FIG. 3A, the distal end portion of the grinding stone 34c being rotated at high speed is positioned at a predetermined outer peripheral region of the back surface 10b of the wafer 10, and the chuck table 32 is rotated in a direction indicated with an arrow R2 to remove the back surface film 16 from the outer peripheral side. Subsequently, the back surface film grinding unit 34 is moved in a direction indicated with an arrow R3. In this manner, the grinding stone 34c of the back surface film grinding unit 34 is moved to the center of the wafer 10, and accordingly, as depicted in FIG. 3B, the back surface film 16 covering the back surface 10b of the wafer 10 is entirely removed. As a result, the exposed portion 10c in which the semiconductor substrate included in the wafer 10 is exposed is formed on the entire back surface 10b of the wafer 10.

Figure 4:
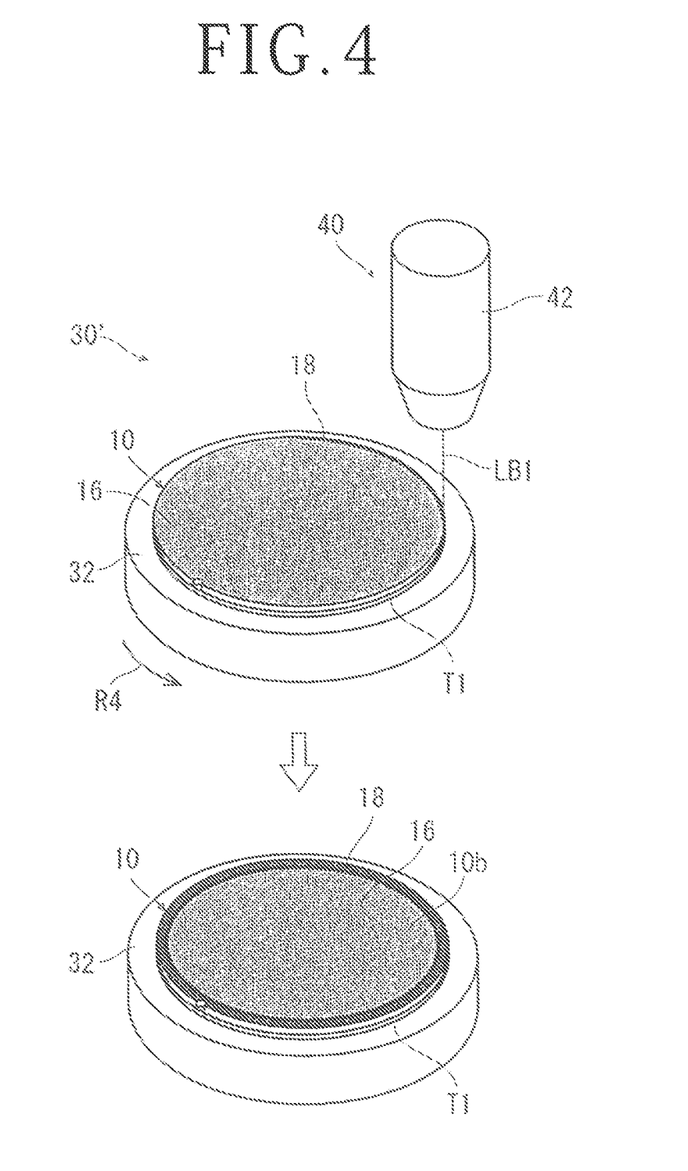
FIG. 4 is a perspective view depicting another manner how the back surface film processing step is carried out.

Moreover, the back surface film processing step of the wafer processing method according to the present invention may be carried out by the back surface film processing apparatus 30' (only partially illustrated) depicted in the upper side of FIG. 4. The back surface film processing apparatus 30' includes a laser beam applying unit 40, in place of the back surface film grinding unit 34 of the back surface film processing apparatus 30 depicted in FIG. 3A. The laser beam applying unit 40 includes a laser oscillator and an optical system having output power adjusting means which are not illustrated, and focusing means 42 which focuses a laser beam LB1 applied from the optical system. When the wafer 10 having the protective member T1 provided on the front surface 10a thereof is transferred to the back surface film processing apparatus 30' in the protective member providing step, the wafer 10 is held under suction on the chuck table 32 in a state in which the back surface 10b of the wafer 10 covered with the back surface film 16 faces upward. Next, the focusing means 42 is moved above the outer peripheral edge of the back surface film 16, and a focusing point of the laser beam LB1 is positioned on the back surface film 16. Subsequently, the chuck table 32 is rotated in a direction indicated with an arrow R4, and the laser beam LB1 of such a wavelength as to be absorbed in the back surface film 16 is applied to the back surface film 16 to carry out ablation processing. Since a width of a roughened portion of the back surface film 16 due to one-time ablation processing is not so large, a position at which the laser beam LB1 is applied is spirally moved from the outer peripheral edge of the back surface film 16 to the center of the wafer 10 such that the laser beam LB1 comes gradually closer to the center of the wafer 10 to carry out the laser processing.

Accordingly, as depicted in the lower side of FIG. 4, a roughened portion 18 in a ring shape in which a state of the back surface film 16 is roughened due to the ablation processing is formed in the outer peripheral region of the back surface film 16. In this manner described above, the back surface film processing step carried out by applying the laser beam to the wafer 10 is completed. A width of a region in which the roughened portion 18 is formed is set to a width of substantially 4 to 5 mm from the outer edge of the wafer 10, for example. According to the back surface film processing step described above, forming the roughened portion 18 in which the state of the back surface film 16 is roughened causes a condition in which the back surface film 16 is likely to be peeled off from the back surface 10b of the wafer 10 with the roughened portion 18 as a start point. Note that the back surface film processing step of the wafer processing method according to the present invention is not limited to application of ablation processing on only the outer peripheral region of the back surface film 16 to be roughened, and the entire region of the back surface film 16 may be subjected to the ablation processing. Moreover, the present invention includes a grinding preparation step and the back surface grinding step, which will be described below.

Figure 5:
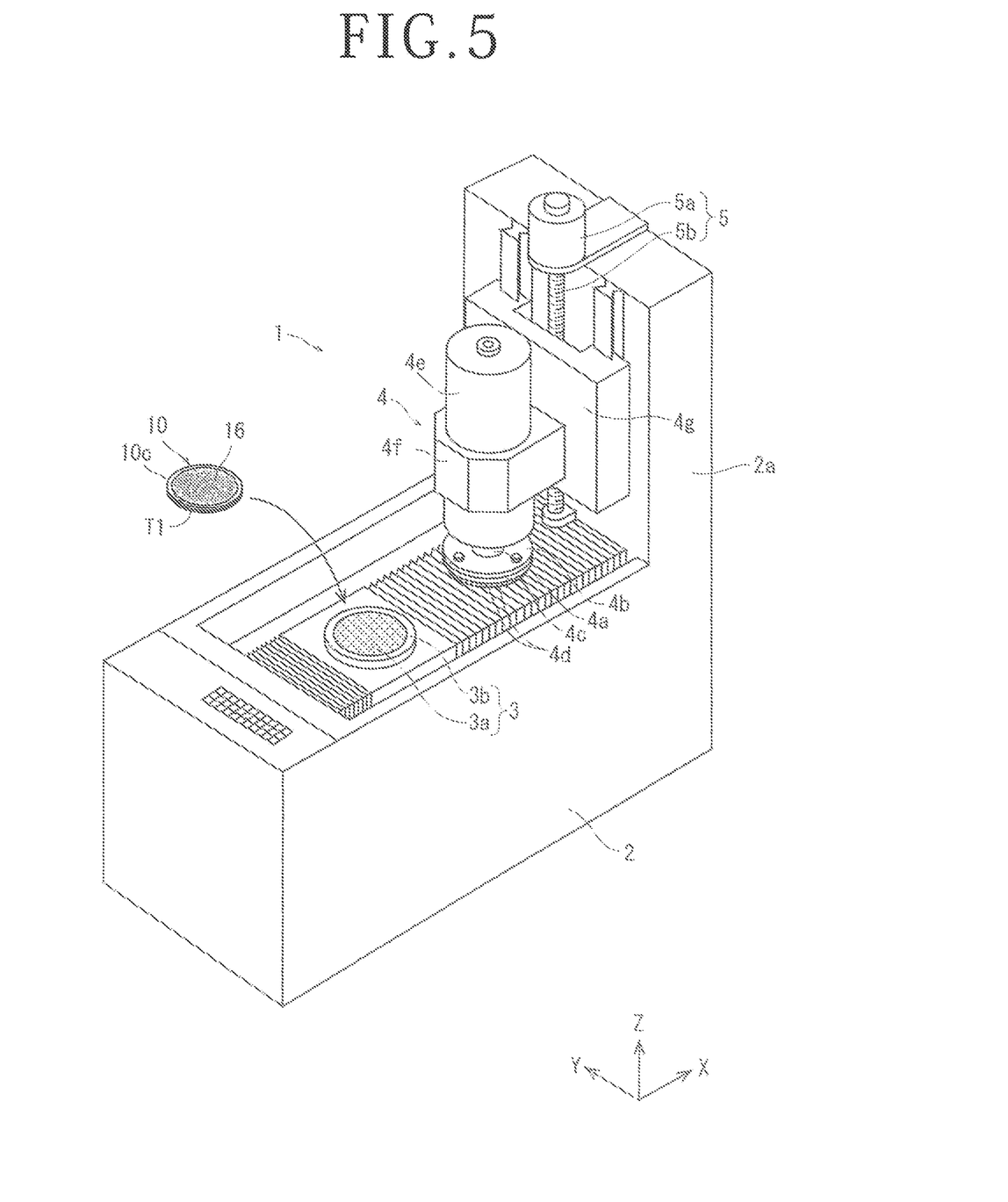
FIG. 5 is a perspective view depicting a grinding apparatus, in whole, which is prepared in a grinding preparation step.

The grinding preparation step is a step of preparing a grinding apparatus 1 in order to grind the back surface 10b of the wafer 10, as depicted in FIG. 5. The grinding apparatus 1 at least includes a grinding unit 4 including a rotatable grinding wheel 4c having grinding stones 4d arranged in an annular shape thereon, a chuck table 3 for holding the wafer 10, and a feeding mechanism 5 which moves the grinding unit 4 in a vertical direction to make the grinding stones 4d of the grinding wheel 4c come closer to and away from the chuck table 3.

The chuck table 3 includes, for example, a suction chuck 3a for holding the wafer 10 under suction and having a gas permeability, and a frame 3b supporting an outer periphery and a bottom surface of the suction chuck 3a and transmitting a negative pressure to the suction chuck 3a. Inside an apparatus housing 2, a moving mechanism (not illustrated) which moves the chuck table 3 in the X-axis direction is disposed.

The grinding unit 4 includes, for example, a spindle 4a, a wheel mount 4b disposed on a lower end of the spindle 4a, a grinding wheel 4c mounted to a lower surface of the wheel mount 4b and formed with the grinding stones 4d in an annular shape on a lower surface of the grinding wheel 4c, an electric motor 4e which rotates the spindle 4a, a support section 4f which supports the grinding unit 4, a Z-axis moving table 4g which is supported to a vertical wall section 2a of the apparatus housing 2 in a vertically movable manner along with the support section 4f in the Z-axis direction. The feeding mechanism 5 can move the grinding unit 4 to an optional position in the Z-axis direction (vertical direction) by converting a rotational motion of a pulse motor 5a into a linear motion via a ball screw 5b being rotated by the pulse motor 5a and transmitting the converted motion to the Z-axis moving table 4g. Note that the grinding stones 4d described above is formed of, for example, stones having a roughness finer than that of the grinding stone 34c of the back surface film grinding unit 34 depicted in FIG. 3A, the grinding stone 34c being provided in order to process the back surface film 16, and stones having a roughness suitable for grinding the semiconductor substrate included in the wafer 10 is selected.

The wafer 10 is transferred to the grinding apparatus 1 that is prepared in the grinding preparation step, after the wafer 10 is subjected to the protective member providing step and the back surface film processing step described above. In this embodiment, the back surface grinding step of grinding the back surface 10b of the wafer 10 which has been subjected to the back surface film processing step described with reference to FIG. 3A will be described.

As depicted in FIG. 5, the wafer 10 transferred to the grinding apparatus 1 is placed and held under suction on the suction chuck 3a of the chuck table 3, with the back surface 10b side of the wafer 10 covered with the back surface film 16 facing upward.

Figure 6:
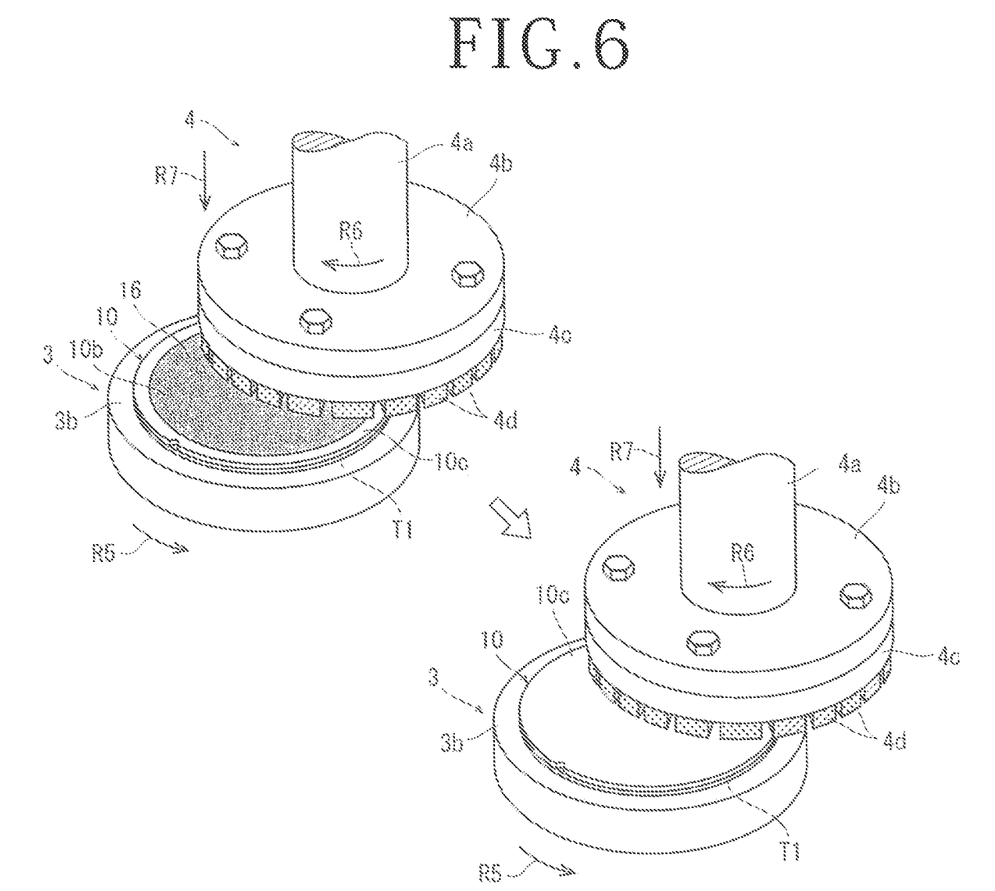
FIG. 6 is a perspective view depicting a manner how a back surface grinding step is carried out by use of the grinding apparatus depicted in FIG. 5.

Then, the moving mechanism described above is actuated to position the chuck table 3 at a grinding position directly below the grinding unit 4. Thereafter, as depicted in FIG. 6, the chuck table 3 is rotated by actuating a rotational driving mechanism not illustrated, in a direction indicated with an arrow R5 at a predetermined rotational speed (for example, 300 rpm), while the spindle 4a of the grinding unit 4 is rotated in a direction indicated with an arrow R6 at predetermined rotational speed (for example, 3000 rpm). Subsequently, the above feeding mechanism 5 is actuated to lower the grinding unit 4 in a direction indicated with an arrow R7, and the grinding stone 4d is brought into contact with the back surface 10b of the wafer 10. Then, the grinding water is supplied to the wafer 10 from grinding water supplying means not illustrated, and the grinding unit 4 is grinding fed at a predetermined speed (for example, 1 μm/s). In the embodiment, as described above, the grinding wheel 4c is set in such a manner as to be rotated from the outer periphery of the wafer 10 toward the inner side thereof. Hence, the grinding stones 4d disposed on the lower surface of the grinding wheel 4c are used to grind the back surface 10b of the wafer 10 from the exposed portion 10c side of the outer periphery formed in the back surface 10b of the wafer 10 toward the inner side of the wafer 10.

Such grinding is carried out, and as a result, the grinding stones 4d cause the back surface film 16 to be peeled off from a boundary region between the exposed portion 10c and the back surface film 16, and as indicated on the right lower side of FIG. 6, the back surface film 16 is rapidly removed to expose the exposed portion 10c of the semiconductor substrate included in the wafer 10 on the back surface 10b side of the wafer 10. Accordingly, the metal film, the oxide film, and other films included in the back surface film 16 are further fined, thereby preventing clogging from being generated in the grinding stones 4d. Subsequent to this, the grinding unit 4 is further lowered to grind the wafer 10 until the wafer 10 is reduced in thickness to a predetermined thickness. As a result, the back surface grinding step is completed. Note that, in carrying out this back surface grinding step, thickness measuring means not illustrated is operated, and the back surface grinding step described above can be carried out, measuring the thickness of the wafer 10. In addition, the back surface grinding step according to the wafer processing method of the present invention is not limited to the embodiment described above, and may be configured such that, by carrying out the back surface film processing step depicted in FIG. 3B, the entire back surface film 16 is removed from the wafer 10, the wafer 10 is transferred to the grinding apparatus 1 described above, and the back surface 10b of the wafer 10 is ground by the grinding unit 4 so as to be thinned to a desired thickness.

The present invention is not limited to the embodiment described above, and the back surface 10b of the wafer 10 processed by the back surface film processing step described on the basis of FIG. 4 may be ground by the grinding apparatus 1 described above. The wafer 10 depicted in FIG. 4 is transferred to the grinding apparatus 1 described above, and according to the similar procedures to those above, the back surface 10b side of the wafer 10 is ground, and the grinding stones 4d cause the back surface film 16 to be peeled off from the back surface 10b of the wafer 10, with the roughened portion 18 as a start point. Accordingly, as depicted in the right lower side of FIG. 6, the back surface film 16 is removed, and the exposed portion 10c of the semiconductor substrate included in the wafer 10 is exposed on the back surface 10b side of the wafer 10. Consequently, the back surface grinding step can rapidly be completed.

Figure 7:
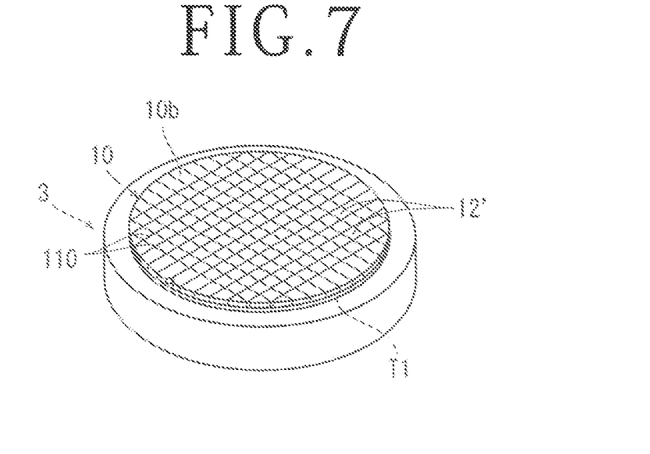
FIG. 7 is a perspective view of the wafer in which breaking grooves are formed along respective cutting grooves.

Moreover, the wafer 10 being subjected to grinding processing by the back surface grinding step according to the wafer processing method of the present invention may be the wafer 10 described on the basis of FIGS. 2A to 2C being subjected to the back surface film processing step described above. The wafer 10 described on the basis of FIGS. 2A to 2C has the cutting grooves 100 formed therein along the division lines 14 on the front surface 10a side, the cutting grooves 100 each having a depth corresponding to the finished thickness of each device 12, and by carrying out the back surface grinding step described on the basis of FIG. 5 and FIG. 6, the wafer 10 is thinned. As a result, as depicted in FIG. 7, breaking grooves 110 for breaking the wafer 10 into individual pieces are formed along the respective cutting grooves 100, and individual device chips 12' are formed.

In addition, the present invention is not limited to the embodiment described above and includes another embodiment to be described below. For example, planarization processing of planarizing the semiconductor substrate that is exposed on the back surface 10b side of the wafer 10 is carried out to the back surface 10b of the wafer 10 having the exposed portion 10c or the roughened portion 18 formed thereon by carrying out the back surface film processing step described above. According to a state of the back surface 10b of the wafer 10 processed by the back surface film processing step, the planarization processing may be grinding processing carried out with use of the grinding apparatus 1 described on the basis of FIG. 5 or may be polishing carried out with use of a polishing apparatus not illustrated. After the back surface film processing step described above is carried out, the planarization processing is carried out, so that a laser beam LB2 of a wavelength passing through the wafer 10 can be positioned inside a corresponding portion of a predetermined division line 14 and applied thereto. As a result, a modified layer forming step described below can favorably be carried out. After the above planarization processing, in carrying out the modified layer forming step, for example, the wafer 10 is transferred to a laser processing apparatus 60 depicted in FIG. 8.

Figure 8:
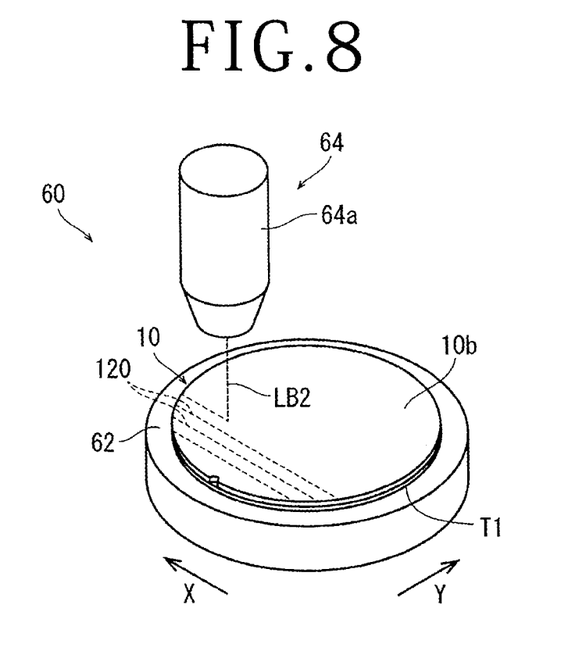
FIG. 8 is a perspective view depicting a manner how a modified layer forming step is carried out.

The laser processing apparatus 60 includes a chuck table 62 and a laser beam applying unit 64 which applies the laser beam LB2 of a wavelength passing through the wafer 10 held on the chuck table 62. The chuck table 62 includes an X-axis feeding mechanism which processing feeds the chuck table 62 and the laser beam applying unit 64 relatively in the X-axis direction, a Y-axis feeding mechanism which processing feeds the chuck table 62 and the laser beam applying unit 64 relatively in the Y-axis direction perpendicular to the X-axis direction, and a rotational driving mechanism which rotates the chuck table 62, any of which are not illustrated.

The wafer 10 which is transferred to the laser processing apparatus 60 is held under suction on the chuck table 62, with the back surface 10b side of the wafer 10 facing upward. An imaging unit (not illustrated) is used to apply an infrared ray to the back surface 10b of the wafer 10 held under suction on the chuck table 62, the division lines 14 on the front surface 10a side are detected, and alignment for detecting the position of the division line 14 is carried out, so that the rotational driving mechanism rotates the wafer 10 to align the division line 14 in a predetermined direction with the X-axis direction. The position information of the detected division line 14 is stored in a controller which is not illustrated.

According to the position information detected by the alignment described above, focusing means 64a of the laser beam applying unit 64 is positioned at a processing start position of the division line 14 in the predetermined direction, positioning a focusing point of the laser beam LB2 inside the wafer 10 corresponding to the division line 14 and applying the laser beam LB2 thereto, while the wafer 10 is processing fed in the X-axis direction along with the chuck table 62. Accordingly, a modified layer 120 is formed inside the wafer 10 along the predetermined division line 14 extending in the first direction. Subsequently, the wafer 10 is indexing fed in the Y-axis direction by an interval of adjacent ones of the division lines 14, and adjacent ones of unprocessed division lines 14 in the Y-axis direction are positioned directly below the focusing means 64a. Then, in the similar manner to that described above, the focusing point of the laser beam LB2 is positioned inside the wafer 10 corresponding to the division line 14, the laser beam LB2 is applied thereto, and the wafer 10 is processing fed in the X-axis direction, so that the modified layer 120 is formed. In the similar manner, the wafer 10 is processing fed in the X-axis direction and is indexing fed in the Y-axis direction. Consequently, the modified layers 120 are formed inside the wafer 10 corresponding to all the division lines 14 along the first direction.

Subsequently, the wafer 10 is rotated at 90 degrees, and the division line 14 extending in the second direction perpendicular to the division lines 14 along which the modified layers 120 have been formed is aligned with the X-axis direction. Then, in the similar manner to that described above, the focusing point of the laser beam LB2 is positioned inside the wafer 10 corresponding to remaining ones of the division lines 14, and the laser beam LB2 is applied thereto, so that the modified layers 120 are formed inside the wafer 10 corresponding to all the division lines 14 formed on the front surface 10a of the wafer 10. Hence, the modified layer forming step is completed.

Figure 9:
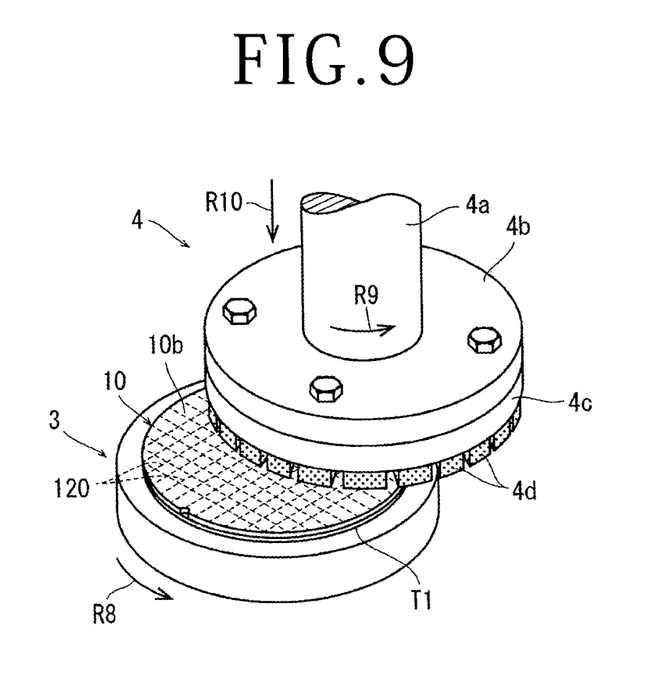
FIG. 9 is a perspective view in which the back surface grinding step is carried out on the wafer formed with a modified layer.
Figure 10:
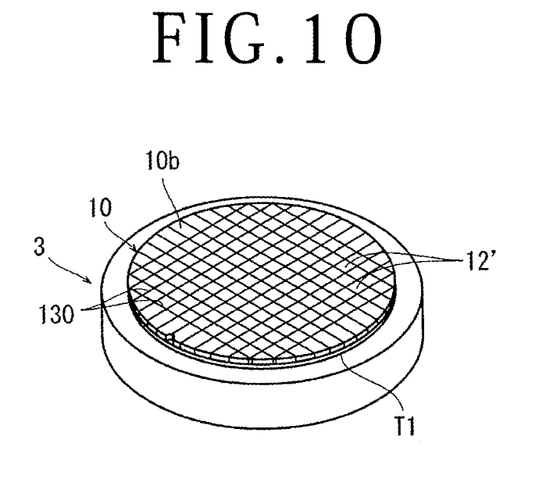
FIG. 10 is a perspective view of the wafer that is divided into individual device chips through the back surface grinding step depicted in FIG. 9.

The back surface grinding step described on the basis of FIGS. 5 and 6 is carried out on the wafer 10 which has been subjected to the modified layer forming step. More specifically, the wafer 10 is transferred to the grinding apparatus 1 and held under suction on the chuck table 3 with the protective tape T side facing downward. Next, as depicted in FIG. 9, the chuck table 3 is rotated by actuating a rotational driving mechanism not illustrated in a direction indicated with an arrow R8 at a predetermined rotational speed (for example, 300 rpm), and the spindle 4a of the grinding unit 4 is rotated in a direction indicated with an arrow R9 at a predetermined rotational speed (for example, 6000 rpm). Then, the feeding mechanism 5 described above is actuated to lower the grinding unit 4 in a direction indicated with an arrow R10, bringing the back surface 10b of the wafer 10 into contact with the grinding stone 4d. Then, the grinding water is supplied from the grinding water supplying means not illustrated, the grinding unit 4 is grinding fed at a predetermined speed (for example, 1 μm/s), and the wafer 10 is ground so as to be thinned to a desired finished thickness of the device 12. As depicted in FIG. 10, breaking grooves 130 are formed with the modified layers 120 as the start points of division, and the wafer 10 is divided into the individual device chips 12'. As a result, the back surface grinding step is completed.

In the present embodiment, a problem that the back surface film 16 including the metal film, the oxide film, and other films causes clogging in the grinding stone 4d is eliminated. Moreover, the back surface film processing step removes or roughens the back surface film 16 of the back surface 10b, and then, the planarizing step described above is carried out. In this case, since the back surface 10b of the wafer 10 is covered with the back surface film 16, the laser beam LB2 is prevented from entering inside the wafer 10, and the modified layer 120 cannot properly be formed. Further, when the infrared ray is applied to the back surface 10b of the wafer 10, the back surface film 16 covering the back surface 10b of the wafer 10 prevents the position of the division line 14 on the front surface 10a side of the wafer 10 from being detected, hindering alignment. Such a problem is also eliminated by the embodiment of the present invention.

Figure 11:
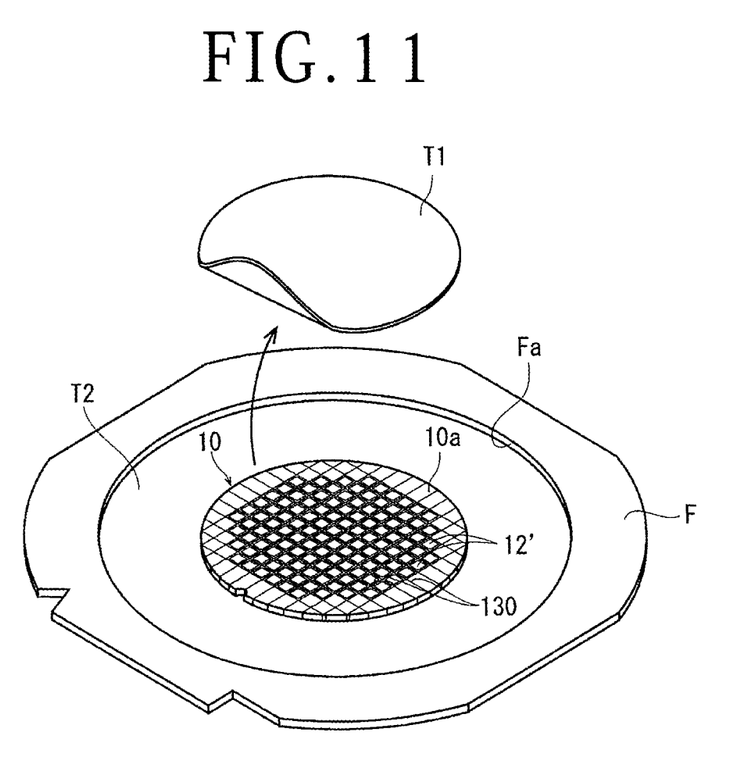
FIG. 11 is a perspective view depicting a manner how the wafer is supported by an annular frame through a tape replacing step.

As described above, by carrying out the back surface grinding step, as depicted in FIG. 7 or FIG. 10, in a state in which the protective member T1 is provided on the wafer 10, the wafer 10 is divided into the individual device chips 12', and a tape replacing step to be described below may be carried out, as needed. More specifically, for example, as depicted in FIG. 7, after the wafer 10 is divided into the individual device chips 12', an annular frame F having an opening Fa that can accommodate the wafer 10 depicted in FIG. 11 is prepared. Then, the wafer 10 is positioned in the center of the opening Fa in a state in which the front surface 10a side faces upward, and a tape T2 having an adhesive layer is attached to the back surface 10b of the wafer 10 and a lower surface of the annular frame F, so that the wafer 10 is supported by the annular frame F through the tape T2. Then, as depicted in FIG. 11, in the protective member providing step described above, the protective member T1 provided on the front surface 10a side of the wafer 10 is peed off from the wafer 10 and removed. In this manner, the wafer 10 is supported by the annular frame F and in order to transfer the wafer 10 to the subsequent step, the wafer 10 is housed in a cassette not illustrated, or transferred to a pick-up step of picking up each of the device chips 12' from the wafer 10.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of grinding a back surface of a wafer having a plurality of devices on a front surface of the wafer, the plurality of devices being separated from each other by a plurality of crossing division lines formed on the front surface of the wafer, the back surface of the wafer being covered by a back surface film, the method comprising:
   a back surface film processing step of removing or roughening at least a portion of the back surface film;
   a grinding preparation step of preparing a grinding apparatus including a grinding unit rotatably provided with a grinding wheel having a plurality of grinding stones in an annular shape disposed on a lower surface thereof, a chuck table for holding the wafer, and a feeding mechanism which moves the grinding wheel in a vertical direction to make the grinding stones of the grinding wheel come closer to and away from the chuck table;
   a protective member providing step of providing a protective member to the front surface of the wafer before or after the back surface film processing step is carried out; and
   after performing the back surface film processing step, a back surface grinding step of holding the protective member side on the chuck table, grinding the back surface of the wafer with the plurality of grinding stones to thin the wafer to a desired thickness;
   wherein the back surface film processing step is a step of positioning a focusing point of a laser beam to an outer periphery of the back surface film that is applied to the back surface of the wafer and applying the laser beam to the back surface film to perform ablation processing, and roughening the back surface film.

2. The wafer processing method according to claim 1, wherein
   the back surface film processing step is a step of removing an outer periphery of the back surface film that is applied to the back surface of the wafer.

3. The wafer processing method according to claim 2, wherein
   a grinding apparatus is used in the grinding step, the grinding apparatus including a grinding unit rotatably provided with a first grinding wheel having the plurality of grinding stones in an annular shape disposed on a lower surface thereof, the chuck table for holding the wafer, and a feeding mechanism which moves the grinding wheel in a vertical direction to make the grinding stones of the grinding wheel come closer to and away from the chuck table.

4. The wafer processing method according to claim 3, wherein,
   in the grinding step, the first grinding wheel is rotated from an outer periphery of the wafer toward an inner side of the wafer.

5. The wafer processing method according to claim 1, wherein
   a grinding apparatus is used in the grinding step, the grinding apparatus including a grinding unit rotatably provided with a first grinding wheel having the plurality of grinding stones in an annular shape disposed on a lower surface thereof, the chuck table for holding the wafer, and a feeding mechanism which moves the grinding wheel in a vertical direction to make the grinding stones of the grinding wheel come closer to and away from the chuck table.

6. The wafer processing method according to claim 1, wherein the wafer is formed of silicon.

7. The wafer processing method according to claim 1, wherein the back surface film processing step is performed using a disc-shaped grinding stone mounted on a distal end portion of a spindle;
   the grinding stone is positioned at a predetermined region of an outer periphery of the back surface of the wafer; and
   a depth of grinding feeding is set at a depth corresponding to a thickness of the back surface film;
   whereby an outer peripheral region other than a central region of the back surface film covering the back surface of the wafer is removed and an exposed portion of the wafer is exposed in a ring shape.

8. The wafer processing method according to claim 7, wherein the exposed portion is set to a width of 4 to 5 mm from an outer edge of the wafer.

9. The wafer processing method according to claim 7, wherein the plurality of grinding stones used in the back surface grinding step have a roughness finer than that of disc-shaped grinding stone used in the back surface film processing step.

10. A wafer processing method of grinding a back surface of a wafer having a plurality of devices on a front surface of the wafer, the plurality of devices being separated from each other by a plurality of crossing division lines formed on the front surface of the wafer, the back surface of the wafer being covered by a back surface film, the method comprising:
    a back surface film processing step of removing or roughening at least a portion of the back surface film;
    a grinding preparation step of preparing a grinding apparatus including a grinding unit rotatably provided with a grinding wheel having a plurality of grinding stones in an annular shape disposed on a lower surface thereof, a chuck table for holding the wafer, and a feeding mechanism which moves the grinding wheel in a vertical direction to make the grinding stones of the grinding wheel come closer to and away from the chuck table;
    a protective member providing step of providing a protective member to the front surface of the wafer before or after the back surface film processing step is carried out; and
    after performing the back surface film processing step, a back surface grinding step of holding the protective member side on the chuck table, grinding the back surface of the wafer with the plurality of grinding stones to thin the wafer to a desired thickness;
    wherein the back surface film processing step is a step of removing an outer periphery of the back surface film that is applied to the back surface of the wafer;
    wherein
    the back surface film processing step is a step of removing a central region of the back surface film, in addition to the outer periphery of the back surface film that is applied to the back surface of the wafer.

* * * * *